United States Patent
Ker et al.

(10) Patent No.: US 6,858,901 B2
(45) Date of Patent: Feb. 22, 2005

(54) ESD PROTECTION CIRCUIT WITH HIGH SUBSTRATE-TRIGGERING EFFICIENCY

(75) Inventors: Ming-Dou Ker, Hsinchu (TW); Kuo-Chun Hsu, Miaoli (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 10/653,303

(22) Filed: Sep. 2, 2003

(65) Prior Publication Data

US 2004/0051146 A1 Mar. 18, 2004

(30) Foreign Application Priority Data

Sep. 16, 2002 (TW) .......................... 91121117 A

(51) Int. Cl.[7] .......................... H01L 23/60; H01L 23/62
(52) U.S. Cl. .................... 257/360; 257/355; 257/356; 257/358; 361/56
(58) Field of Search .......................... 257/173, 174, 257/355–358, 360–363; 361/56, 58, 111

(56) References Cited

U.S. PATENT DOCUMENTS

2002/0033507 A1 * 3/2002 Verhaege et al. ........... 257/360

* cited by examiner

Primary Examiner—Minhloan Tran
Assistant Examiner—Thomas L Dickey
(74) Attorney, Agent, or Firm—Thomas, Kayden, Horstemeyer, & Risley

(57) ABSTRACT

An ESD protection circuit with high substrate-triggering efficiency. The circuit comprises a multi-finger-type device having a plurality of finger gates below which a parasitic BJT is formed, a plurality of finger sources, each of which is an emitter of one parasitic BJT, and at least one finger drain coupled to a pad, a plurality of voltage drop elements, each of which is coupled between one of the finger sources and a power line to detect a transient current flowing through one of the finger gates, and a plurality of feedback circuits, each of which is coupled between a base and an emitter respectively of a first and second parasitic BJT, and activates the first BJT to bypass ESD current during an ESD event.

18 Claims, 16 Drawing Sheets

ESD PROTECTION CIRCUIT WITH HIGH SUBSTRATE-TRIGGERING EFFICIENCY

BACKGROUND OF THE INVENTION

1. Field of the Invention

The present invention relates to an ESD protection circuit and particularly to an ESD protection circuit with high substrate-triggering efficiency.

2. Description of the Related Art

Electrostatic discharge (ESD) is a transient process of high energy transformation from external to an integrated circuit (IC) internal when the IC is floated. The total discharge process lasts about 100 ns, and several hundred volts, up to several thousand volts are transferred during an ESD event. Such high voltage transformation causes the gate oxide of the input stage to breakdown and further cause circuit malfunctions. As gate oxide thickness is continuously scaled down, it becomes important to design a protection circuit or device to protect the gate oxide that effectively discharges ESD stress.

The models related to ESD stress include the human body model (HBM), machine model (MM) and charged device model (CDM). For commercial IC products, the general ESD specification requires that IC products must pass certain ESD tests, for example, HBM ESD stress of greater than +/−2 kV, MM ESD stress of greater than +/−200V and CDM ESD stress of greater than +/−1 kV, respectively. In order to sustain such high ESD voltage, efficient and robust protection circuits, which usually require large layout dimensions, should be used.

To achieve the above object, several protection circuits, including the following, have been proposed.

Gate-Grounded NMOS and Gate-to-VDD PMOS

A gate grounded NMOS and a gate shorted to VDD PMOS used as protection circuits of an input pad are shown in FIG. 1. Under normal operating conditions, the ESD protection circuits are in a non-conductive state and thus do not interfere with the voltage level on the input pad. In all process generations of CMOS technology, the breakdown voltage of the drain junction is smaller than that of gate oxide, and an ESD protection circuit can be designed on the basis of this characteristic. The difference of the breakdown voltage between drain junction and gate oxide, however, becomes smaller as the gate oxide thickness shrinks. The design margin also narrows, that is to say, if the design or the process technology is not optimal, the gate oxide will be damaged before the junction breakdown of the drain terminal. In the positive-to-VSS ESD zapping condition, avalanche breakdown occurs in the drain terminal of the gate grounded NMOS, and substrate current is also generated. The base voltage of parasitic lateral NPN (drain/substrate/source) is elevated because of the voltage drop across the substrate resistor due to the substrate current. As soon as the base/emitter junction is forward biased, the lateral NPN will be activated to bypass the ESD current. Additionally, the voltage of the input pad will be clamped at the holding voltage of lateral NPN. In the negative-to-VSS ESD zapping condition, the parasitic diode (P_sub/n+_drain) is triggered on to bypass the ESD current. This process is independent of any breakdown mechanism. In the negative-to-VDD ESD zapping condition, the avalanche breakdown occurs in the drain terminal of gate shorted to VDD PMOS. Then the parasitic lateral PNP (drain/n_well/source) is forward biased to bypass the ESD current using the same mechanism as the gate grounded NMOS. In the positive-to-VDD ESD zapping condition, parasitic junction diode (p+_drain/n_well) is forward biased to bypass ESD current. This process is also independent of any breakdown mechanism.

Input Protection Circuits with Equal Substrate Resistance

In the traditional multi-finger NMOS layout technique, the center finger NMOS is usually first activated because of its higher substrate resistance. As the center finger NMOS is activated, the pad voltage is kept at a lower potential, leaving other fingers inactive. The total ESD current will be concentrated in the center finger NMOS and cause failure due to overheating. For an NMOS using this layout, the ESD level cannot be improved with increasing the layout area of the protection circuit. Therefore, a new layout design, shown in FIG. 2, was proposed in U.S. Pat. No. 5,811,856 by Taiwan Semiconductor Manufacturing Company in 1995. The new layout is accomplished by adding a P+ diffusion adjacent to the source terminal of each finger NMOS device approximately equal to the base resistance of each parasitic bipolar transistor. When ESD zapping is connected to the input pad, the parasitic bipolar transistors will conduct simultaneously and with equal current, thus preventing circuit failure due to overheating.

Gate-Coupled Technique for ESD Protection

FIG. 3 shows a gate-coupled ESD protection circuit. It includes a capacitor, a resistor, and an NMOS/PMOS transistor. The NMOS/PMOS transistor is configured with a drain connected to the input pad and a source connected to the VSS/VDD. The capacitor is connected between the input pad and the gate of the NMOS/PMOS transistor. The resistor is connected between the VSS/VDD and the gate of the NMOS/PMOS transistor. The values of the capacitor and resistor can be tuned for coupling a portion of a voltage to the gate of an NMOS/PMOS only under ESD zapping. By using this circuit, the triggered voltage of ESD protection device can be lowered to rapidly protect the thin gate oxide of the internal circuit. In addition, the disadvantage of non-uniform NMOS activation can be ameliorated.

Substrate-Triggering Technique for ESD Protection

FIG. 4 shows a substrate-triggering ESD protection circuit. Similar to the circuit using the gate coupled technique, it includes a capacitor, a resistor, and an NMOS transistor. The NMOS is configured with a drain connected to the input pad and a source connected to the VSS. The gate and the source of NMOS are shorted together. The capacitor is connected between the input pad and the body of the NMOS transistor. The resistor is connected between the VSS and the body of the NMOS transistor. The values of capacitor and resistor can be tuned for coupling a portion of voltage to the body of the NMOS only under ESD zapping. Therefore, the parasitic NPN bipolar transistor can be triggered without through avalanche breakdown mechanism. In addition, the triggered voltage of the NMOS can be lowered and the disadvantage of non-uniform NMOS activation can also be improved with this technique.

SUMMARY OF THE INVENTION

Accordingly, an object of the present invention is to provide an efficient substrate-triggering NMOS/PMOS circuit which improves the non-uniform conduction of MOS- FET with multi-finger layout, enhancing the design flexibility of on-chip ESD protection circuits and the ESD level of IC devices.

One embodiment provides an ESD protection circuit with high substrate-triggering efficiency. The circuit comprises a multi-finger-type device having a plurality of finger gates below which parasitic BJTs are formed, a plurality of finger sources, each of which is an emitter of one of the parasitic BJTs, and at least one finger drain coupled to a pad, a plurality of voltage drop elements, each of which is coupled between one of the finger sources and a power line to detect a transient current flowing through one of the finger gates, and a plurality of feedback circuits, each of which is coupled between a base and an emitter respectively of a first and second parasitic BJTs, and turns on the first BJT to bypass an ESD current during an ESD event.

Another embodiment provides an ESD protection circuit with high substrate-triggering efficiency formed on a substrate of a second conductivity. The circuit comprises a guard ring of the second conductivity formed on the substrate as a contact region thereof, a plurality of fingers enclosed by the guard ring, each of which has a finger source formed by a first doping region of a first conductivity, a finger drain formed by a second doping region of the first conductivity and coupled to a pad, a finger gate between the first and second doping region, and a substrate current input node formed by a third doping region of the second conductivity enclosed by the second doping region, wherein the first and second doping region, and the proximate substrate form a parasitic BJT, a plurality of resistors formed by wells, each of which is coupled between one of the finger sources and a power line, and internal connection circuits coupling one of the finger sources to one of the substrate current input node to turn on a second parasitic BJT by a current flowing through a first parasitic BJT and one of the resistors coupled thereto during an ESD event.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

Figure 1:
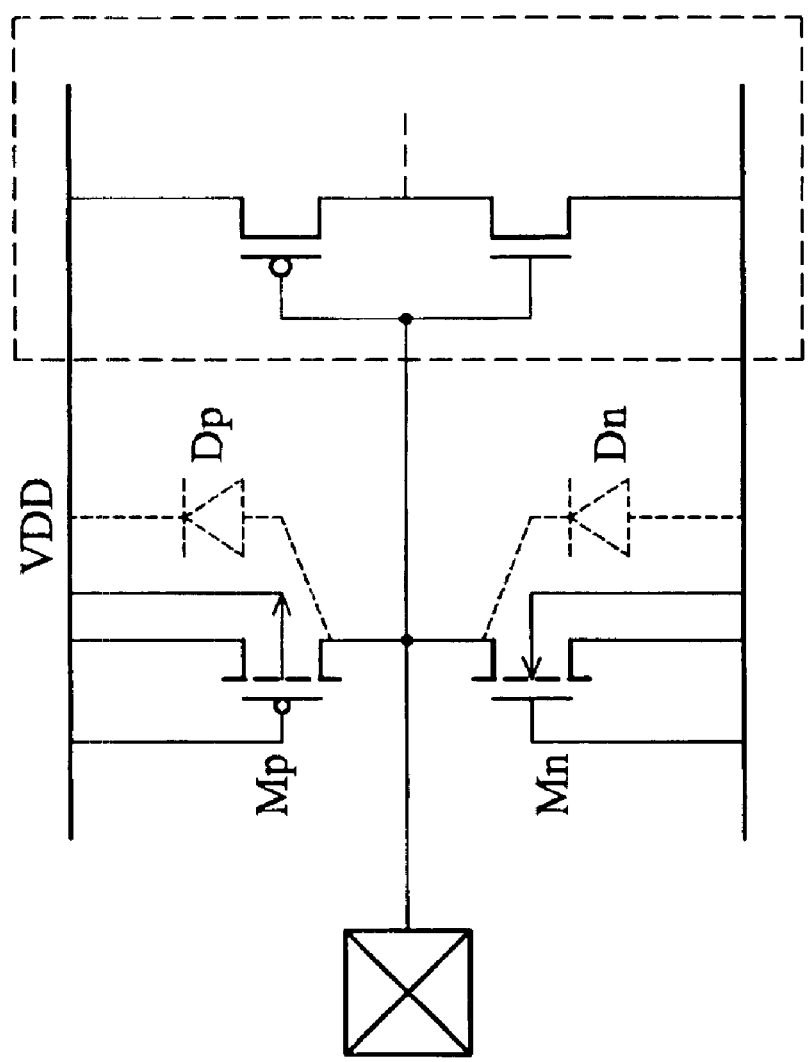
FIG. 1 is a diagram of a conventional input port circuit with ESD protection.
Figure 2:
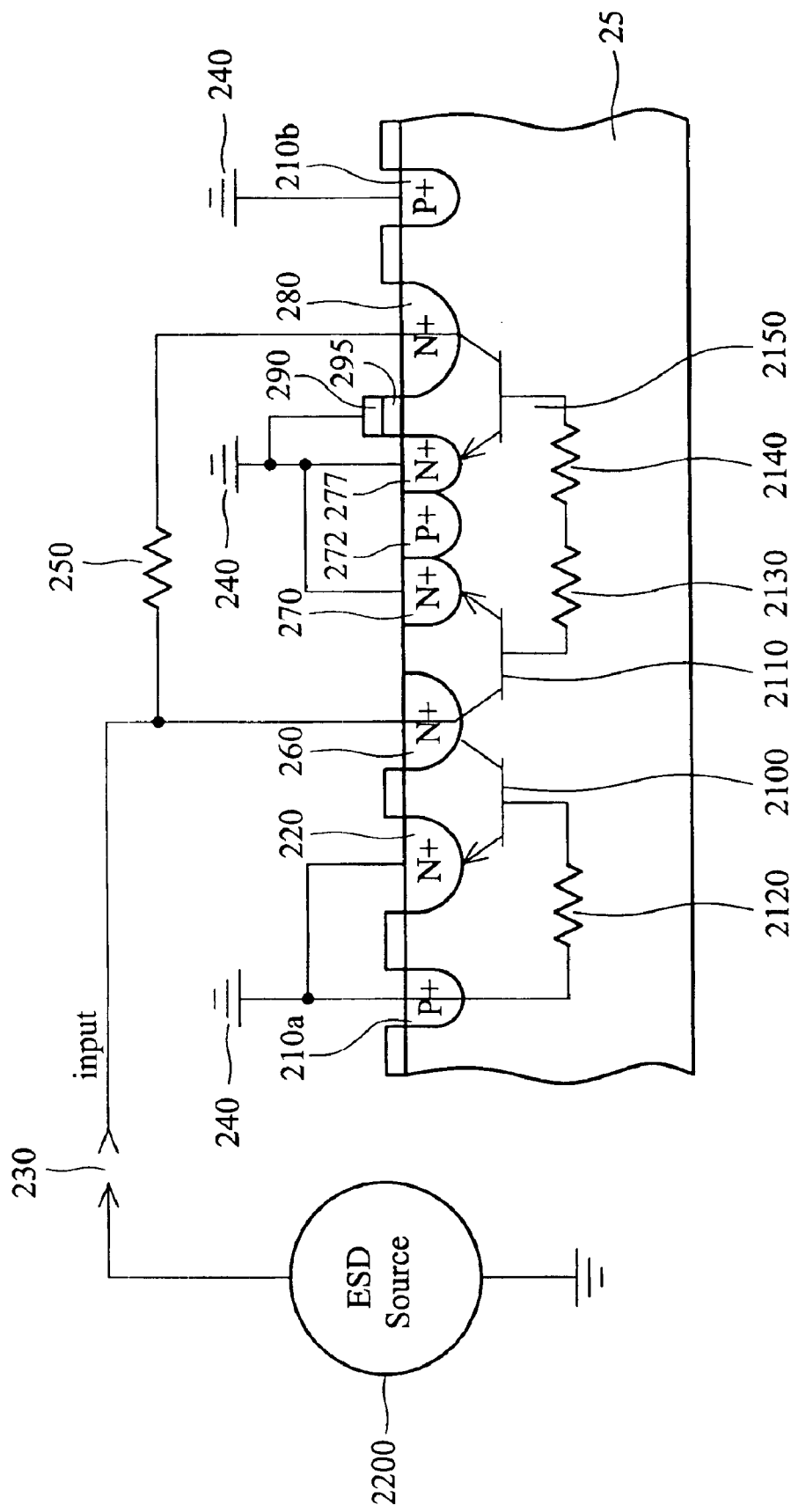
FIG. 2 is a new layout design of multi-finger-type NMOS with equal substrate resistance.
Figure 3:
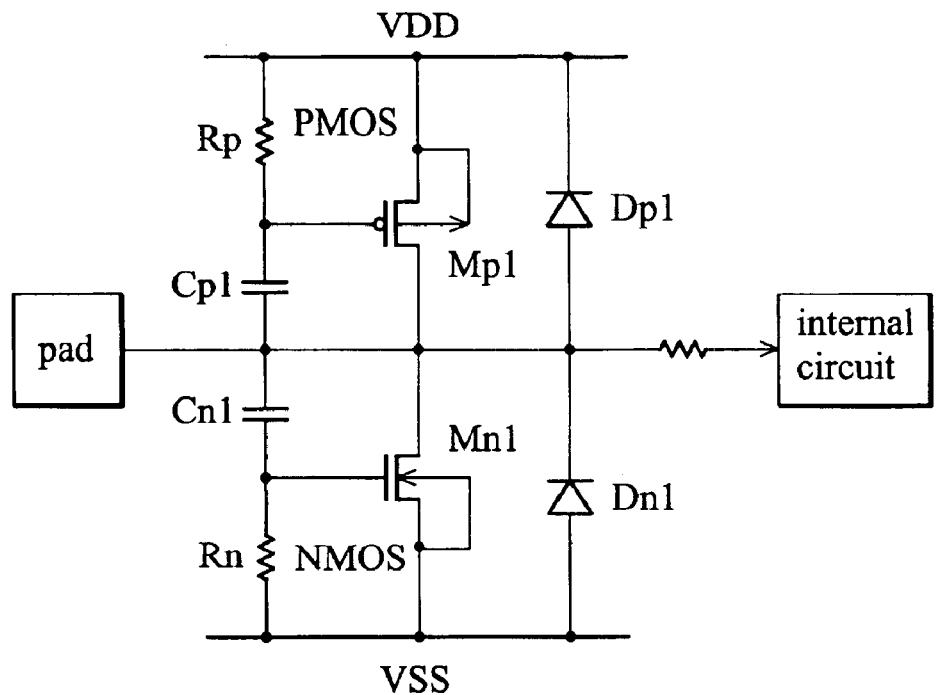
FIG. 3 is a schematic of a conventional ESD protection circuit with gate-coupled techniques.
Figure 4:
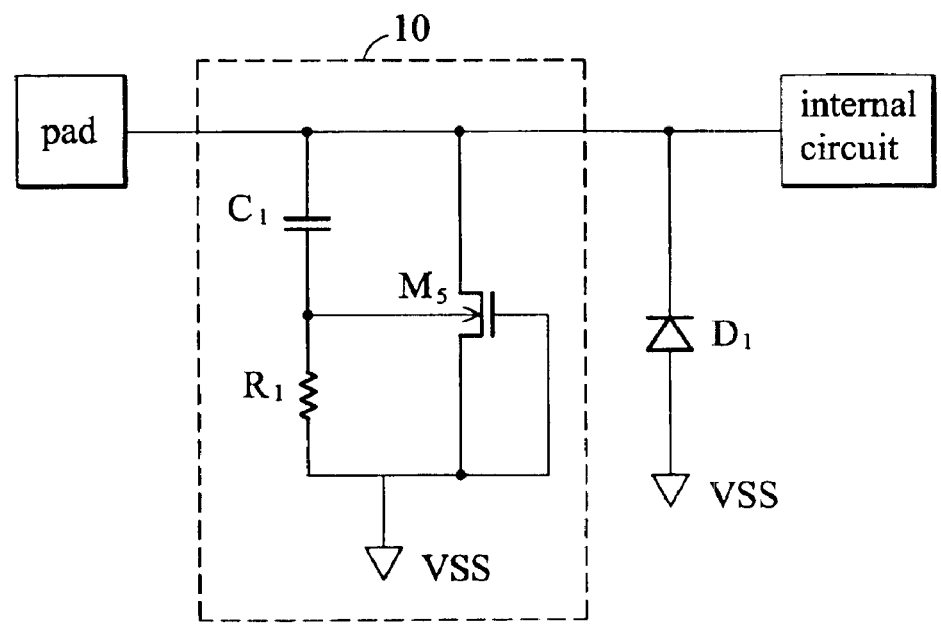
FIG. 4 is a schematic of a conventional ESD protection circuit with substrate-triggering techniques.
Figure 5:
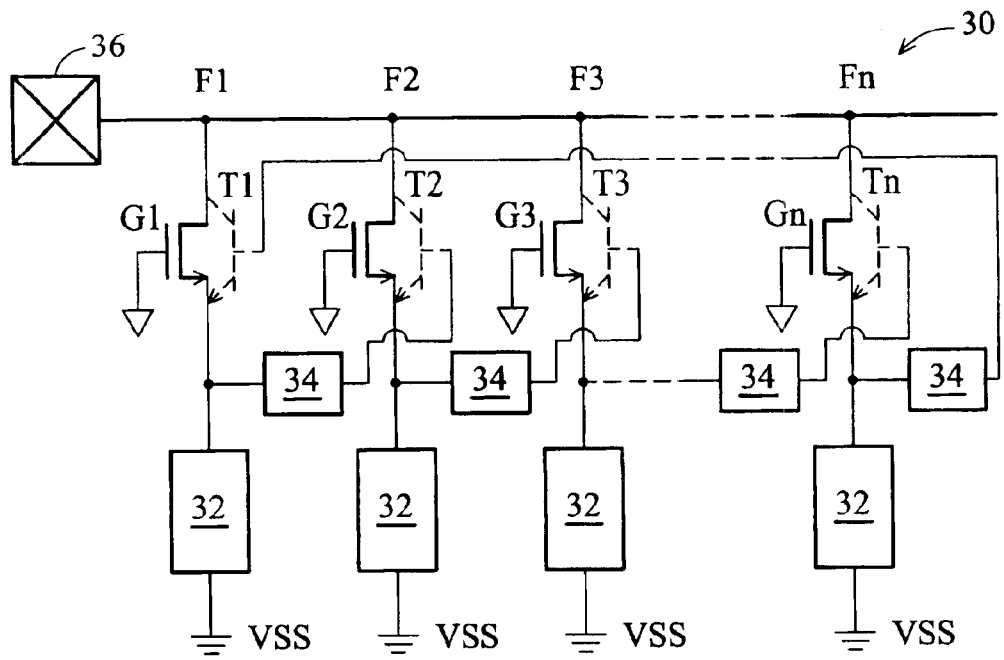
FIG. 5 is a schematic of an NMOS protection circuit.

FIG. 5 is a diagram showing an implementation of an NMOS protection circuit according to one embodiment of the invention. The ESD protection circuit 30 includes a multi-finger-type NMOS composed of fingers G1–Gn, voltage drop elements 32 and feedback circuits 34. The finger drains are commonly coupled to a pad 36. Each of the voltage drop elements is coupled between one of the finger sources and the VSS line. The finger drain, bulk and finger source of each finger are the collector, base and emitter of one of the parasitic BJTs T1–Tn. Each feedback circuit is coupled between the emitter and base of one of the BJTs T1–Tn.

The operation of the circuit is explained in the following. When the multi-finger-type NMOS fails to be uniformly triggered during an initial phase of ESD zapping, for example, only the finger G1 is activated, a large current flows through the finger G1 and the voltage drop element 32 coupled thereto, which raises the voltage level on the emitter of the BJT T1. By the feedback circuit 34 and substrate triggering, the voltage level on the base of the BJT T2 is also pulled up when the voltage on the emitter of the BJT T1 raises to a certain level, whereby the BJT T2 is activated and the ESD current also flows through the finger G2. Triggering on the finger G1 activates the finger G2 and similarly, the fingers G3–Gn are also activated. Thus, all the fingers start to conduct the ESD current if any one of the fingers is activated. This chain-reaction improves the ESD level of the circuit in FIG. 5.

Figure 6:
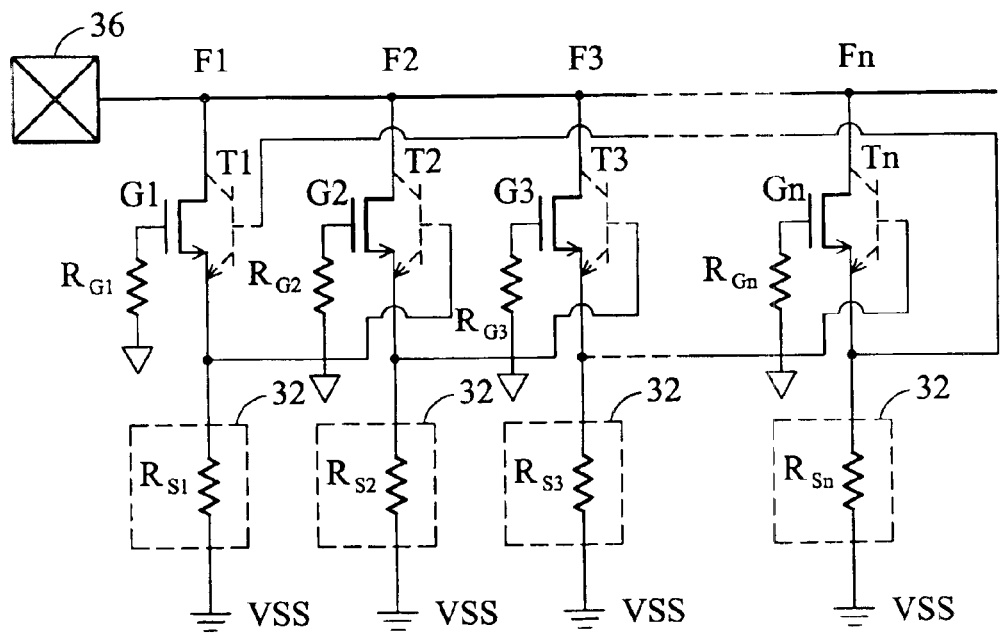
FIG. 6 is a schematic of an ESD protection circuit in which fingers are used only for ESD protection.

FIG. 6 is a diagram showing an ESD protection circuit similar to that in FIG. 5 except that its fingers are used only for ESD protection. The finger gates are coupled to VSS directly or through resistors. The voltage drop elements are implemented by resistors Rs1–Rsn. The feedback circuits 34 of FIG. 5 are composed of internal connection wires, each of which connects the emitter of one BJT to the base of another BJT.

Figure 7:
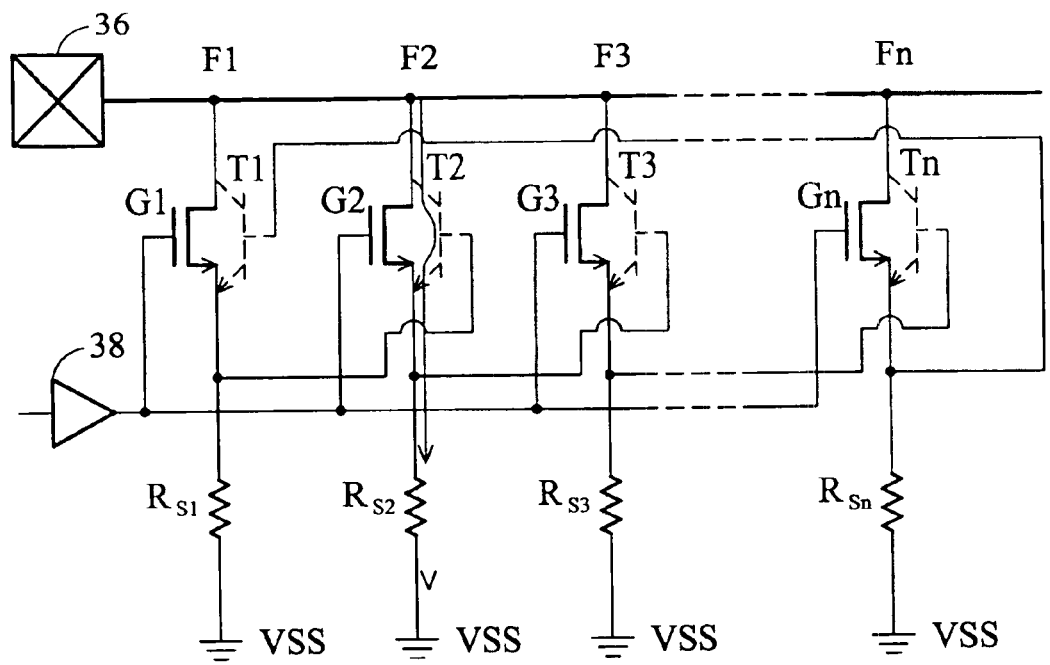
FIG. 7 is a schematic of an ESD protection circuit in which fingers are used for ESD protection and for output port driving.

FIG. 7 is a diagram showing an ESD protection circuit similar to that in FIG. 5 except that its fingers are used for ESD protection and for output port driving. All (as shown in FIG. 7) or some of the fingers are coupled to a pre-driver.

Figure 8:
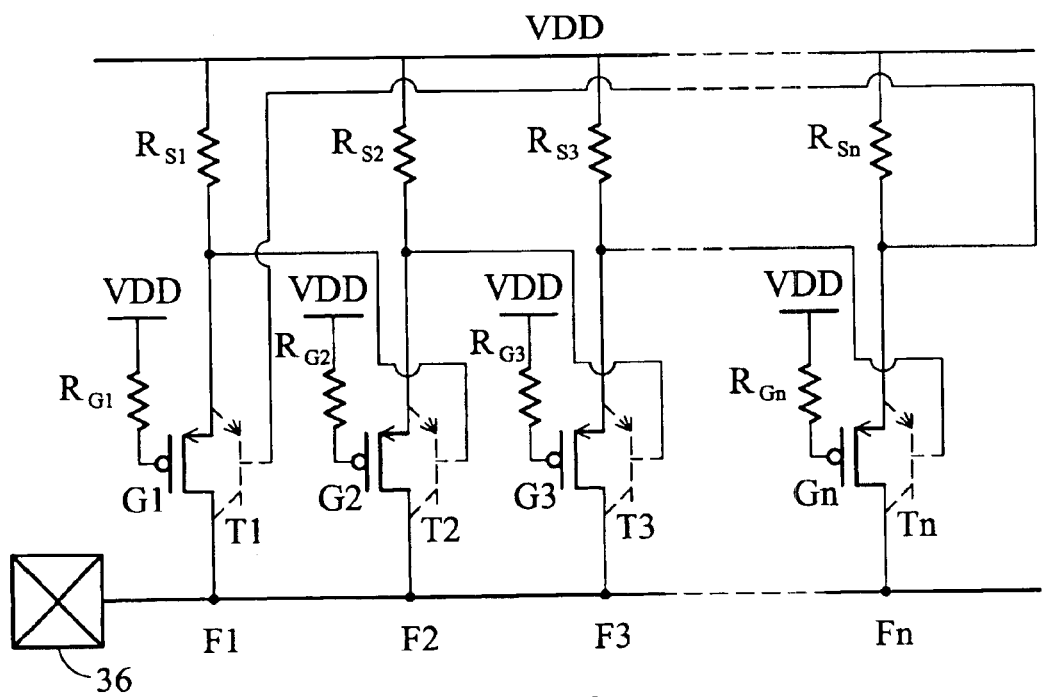
FIGS. 8 and 9 are schematics of PMOS implementations of ESD protection circuits.
Figure 9:
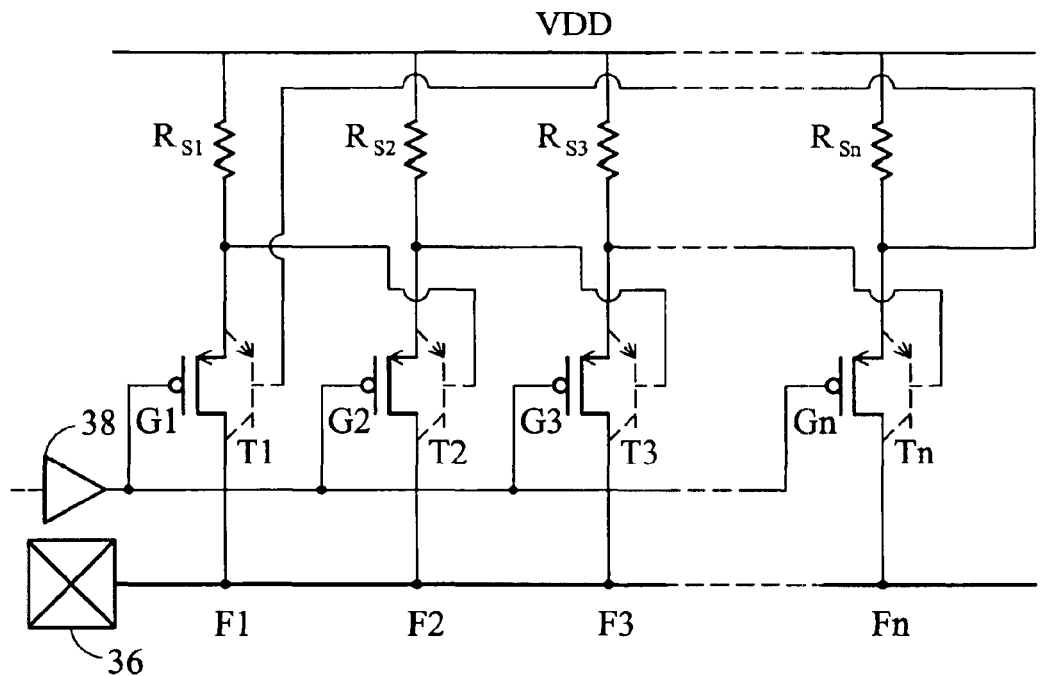

FIGS. 8 and 9 are diagrams showing PMOS implementations of ESD protection circuits according to another embodiment of the invention. All the finger gates of the circuit shown in FIG. 8 are coupled to the VDD line so that the finger gates are inactive during normal operation, which provides suitable ESD protection for the input ports. All the finger gates of the circuit in FIG. 9 are coupled to a pre-driver 38, which provides suitable ESD protection for output ports or may be used as a post driver.

Figure 10:
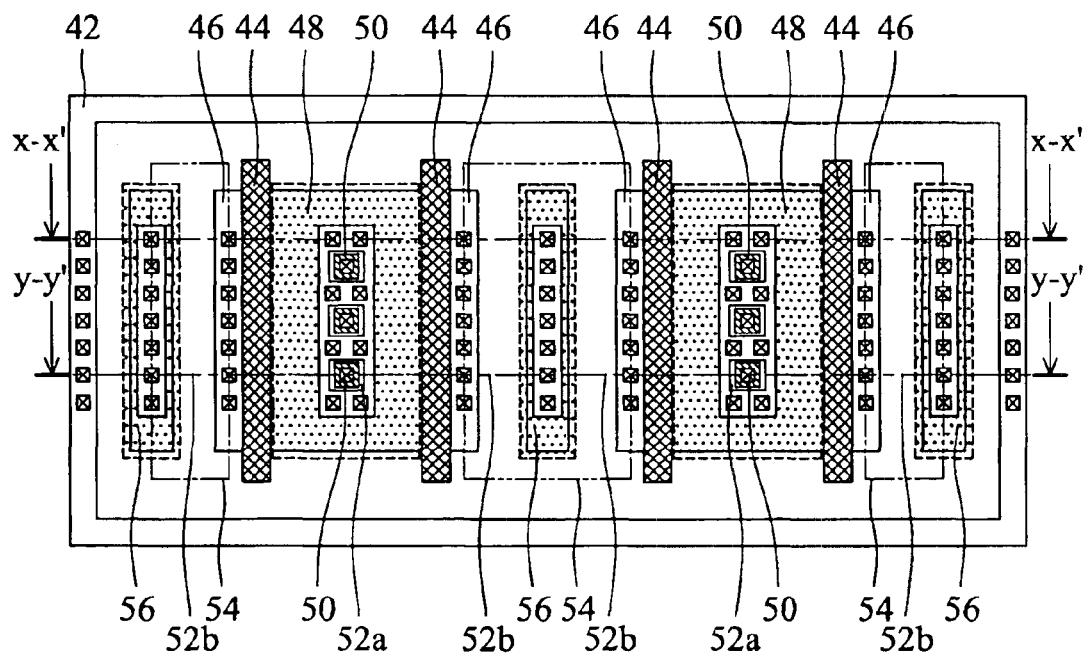
FIG. 10 is a diagram of a layout of a 4-finger NMOS implementation of an ESD protection circuit.
Figure 11A:
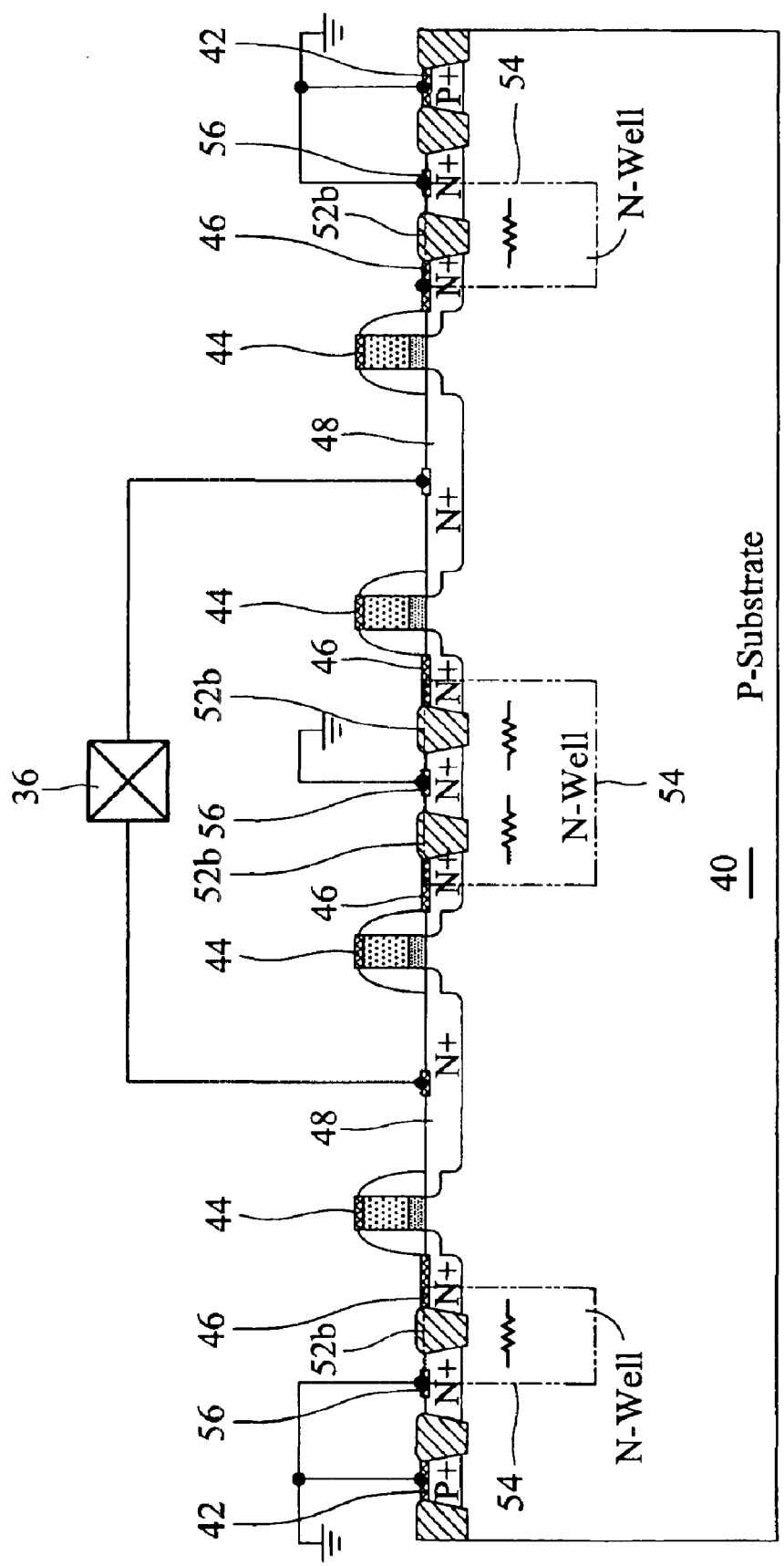
FIGS. 11A and 11B are cross sections of the layout in FIG. 10 along the lines XX' and YY'.
Figure 11B:
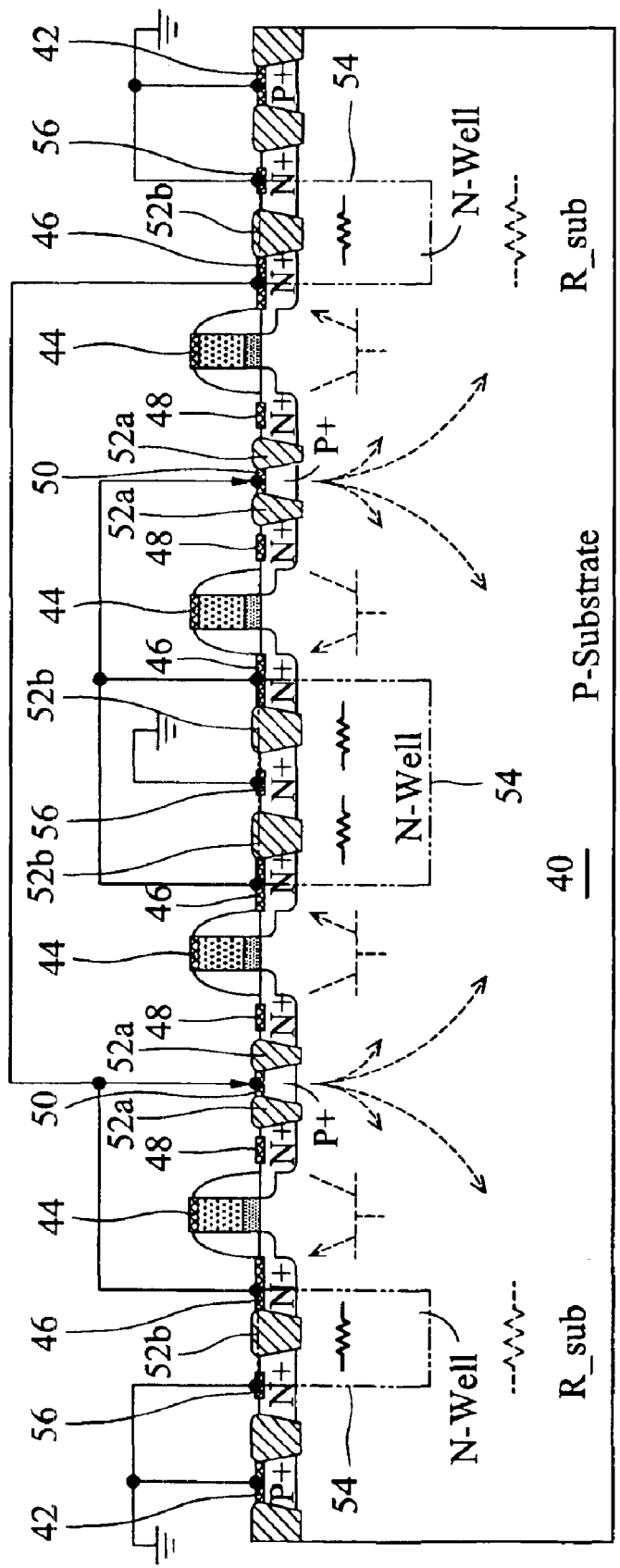

FIG. 10 is a diagram showing a layout of an ESD protection circuit implemented with a 4-finger NMOS according to another embodiment of the invention. FIG. 11A and 11B are cross sections along the lines XX' and YY'. The 4-finger NMOS is formed on a substrate 40 and enclosed by a P+ doping region used as a guard ring for the NMOS and a contact region coupling the substrate 40 to VSS.

Each of the fingers has a finger gate 44, finger source, a finger drain and a substrate current input node, and overlaps with another adjacent finger. The finger sources are N+ doping regions 46. The finger drains are N+ doping regions 48 coupled to a pad 36. The substrate current input nodes are P+ doping regions 50, each of which is enclosed by one of the N+ doping regions 48. The P+ doping regions 50 are isolated from the N+ doping regions 48 by field oxides 52a. The field oxides 52a are implemented by STI (Shallow Trench Isolation) or LOCOS (local oxidation).

In FIG. 11B, it is noted that a parasitic NPN BJT is formed below each finger gate. The N+ doping region 48, P substrate 40 and N+ doping region 46 are the collector, base and emitter of the parasitic BJT. The base is coupled to the P+ doping region 42 through the spread resistor of the substrate 40 and also coupled to the substrate current input node 50. The current flowing into the substrate 40 through the node 50 raises the voltage level on the base of the parasitic S This activates the BJT to bypass the ESD current.

An N well 54 is disposed near the N+ doping regions 46 and forms a resistor. The N well 54 has two sides adjacent to N+ doping regions 46 and 56. The N+ doping region 56 is coupled to VSS. The field oxide 52b may be formed above the N well 54 to isolate the N+ regions 56 and 46 from each other as well as to increase the resistance of the N well 54.

In FIG. 11B, it is further noted that internal connection circuits connect the finger sources on the left and right of the figure to the substrate current input node 50 on the left of the figure, and the finger sources in the center of the figure to the substrate current input node 50 on the right of the figure.

The previously described chain-reaction which uniformly activates all the fingers may also occur in the ESD protection circuit shown in FIGS. 11A and 11B. For the sake of simplicity its description is omitted.

Alternatively, each of the feedback circuits may not only couple one of the finger sources to the base of one of the BJTs, but it may couple one of the finger sources to the bases of several BJTs, or even to the bases of all the BJTs. Therefore, the current flowing through one voltage drop element 32 may turn on more than one BJT, as shown in FIGS. 12–15.

Figure 12:
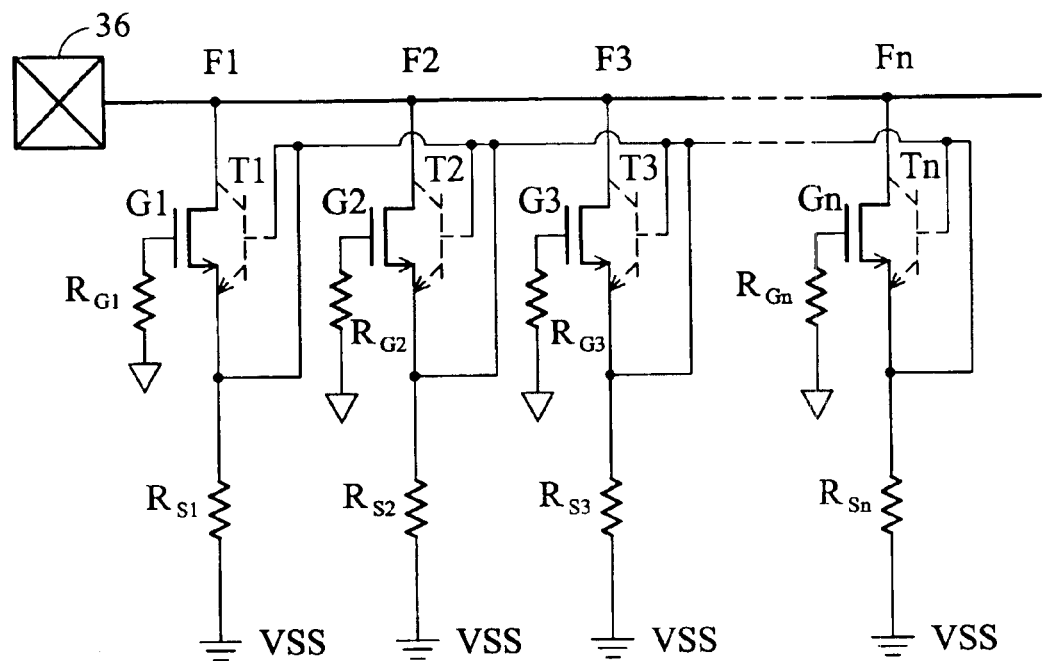
FIGS. 12–15 are schematics of ESD protection circuits capable of simultaneous activation of multiple parasitic BJTs.
Figure 13:
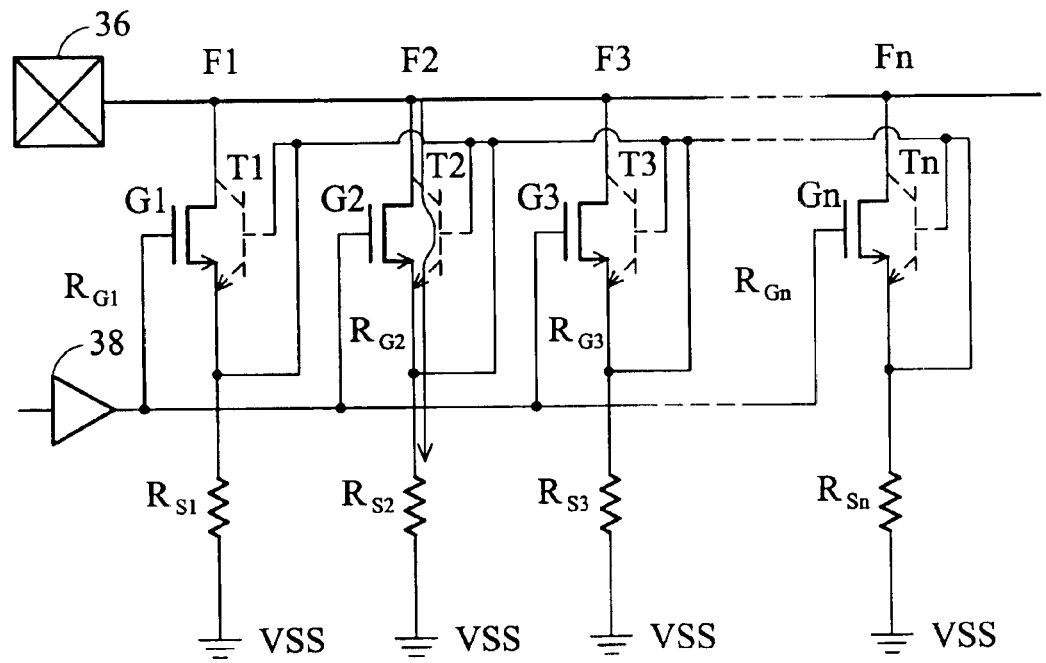
Figure 14:
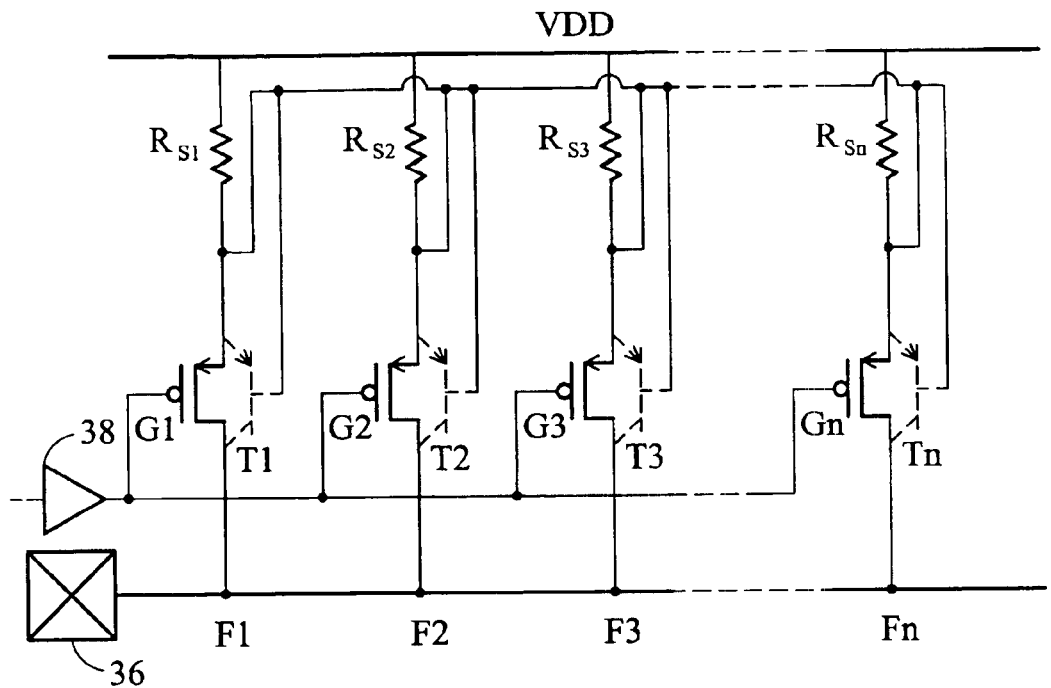
Figure 15:
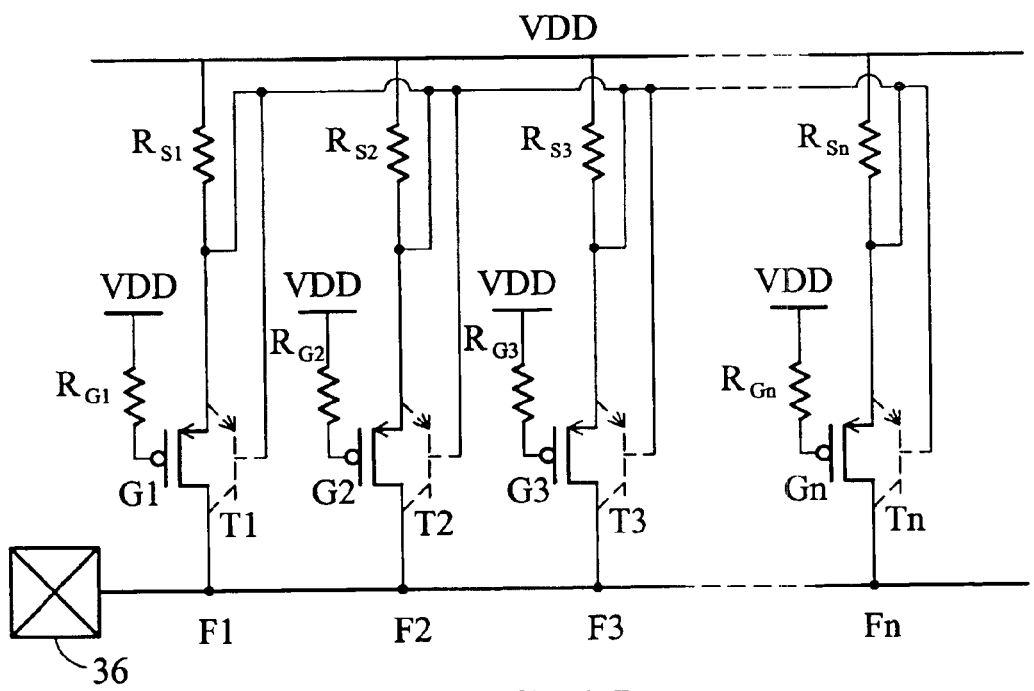
Figure 16:
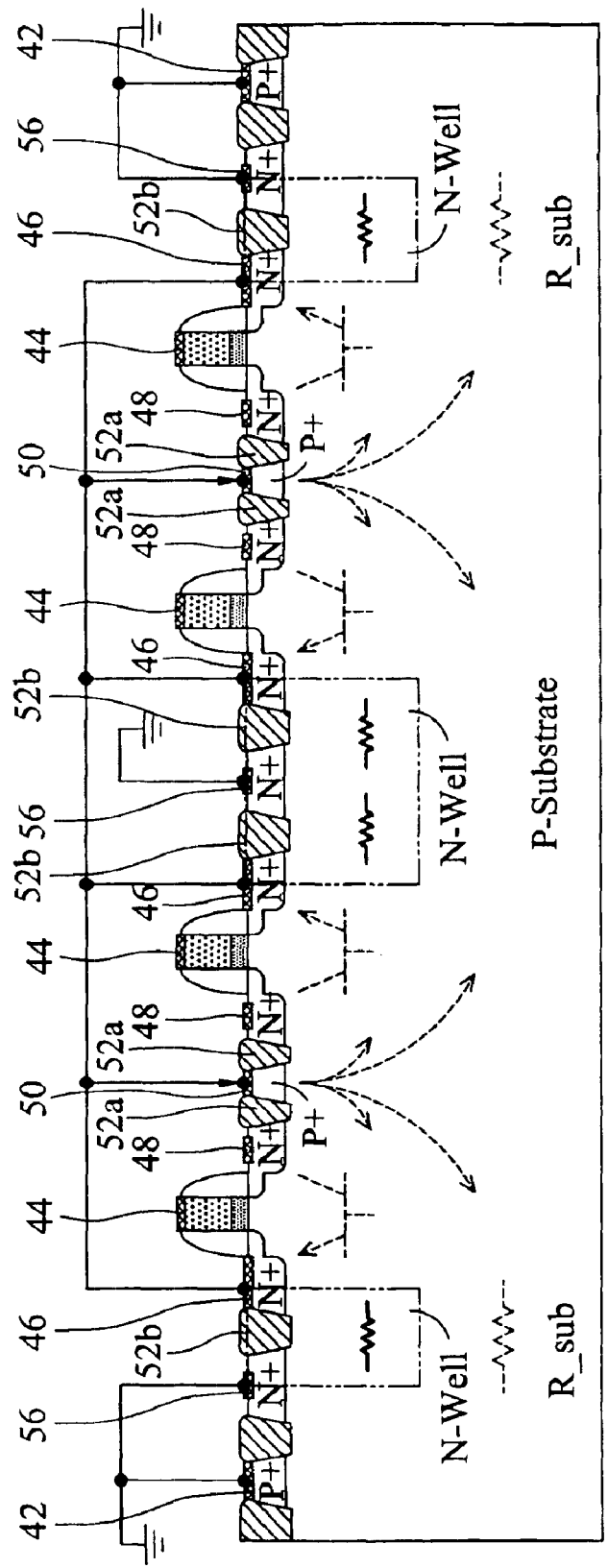
FIG. 16 is a cross section of a multi-finger NMOS applicable to the circuit in FIG. 12.

FIG. 16 is a cross section of a multi-finger NMOS applicable to the circuit in FIG. 12, wherein the parasitic BJTs are simultaneously activated.

Figure 17:
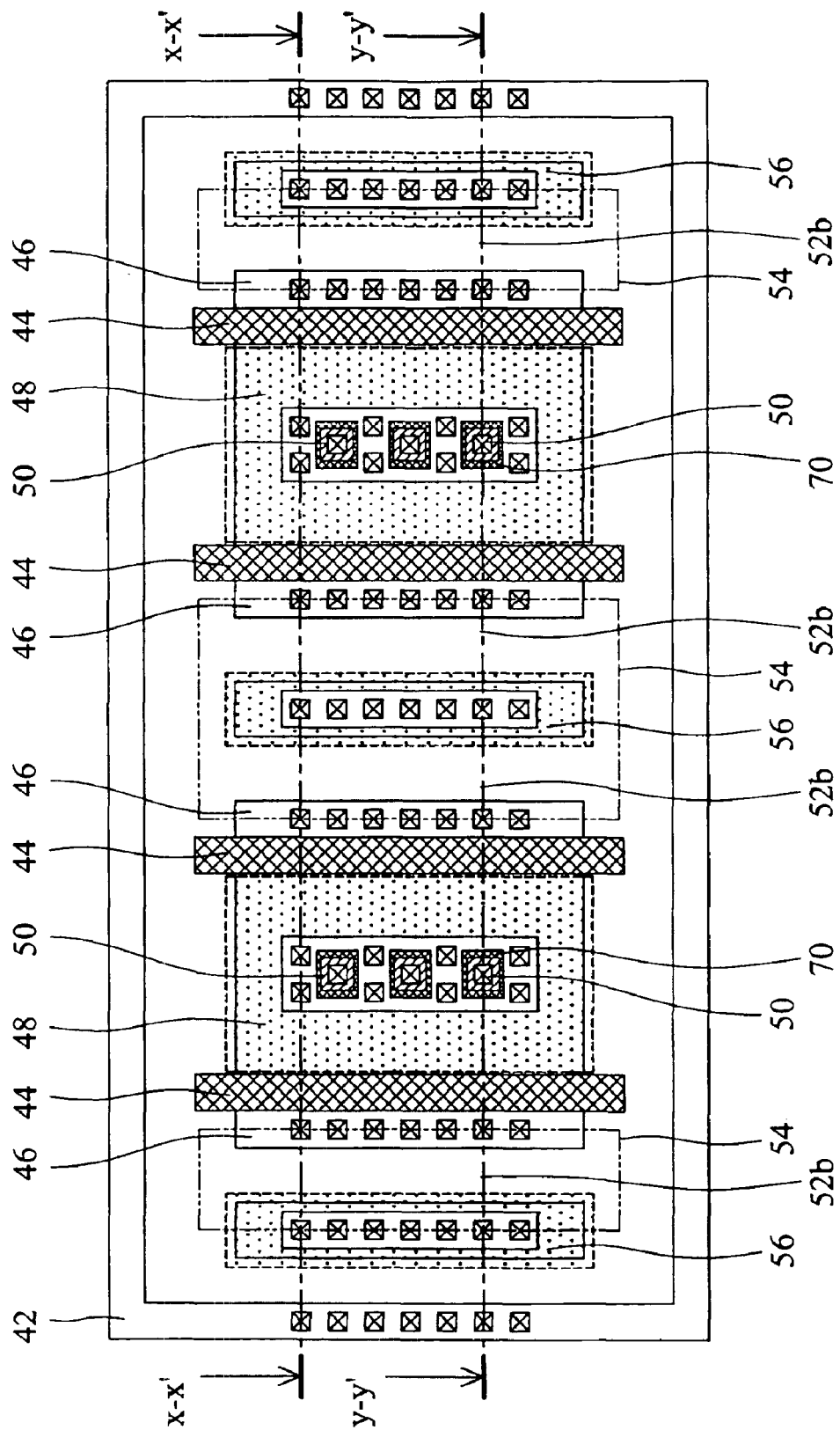
FIG. 17 is a layout of a multi-finger-type NMOS with dummy gates isolating finger drains and substrate current input nodes from each other.
Figure 18:
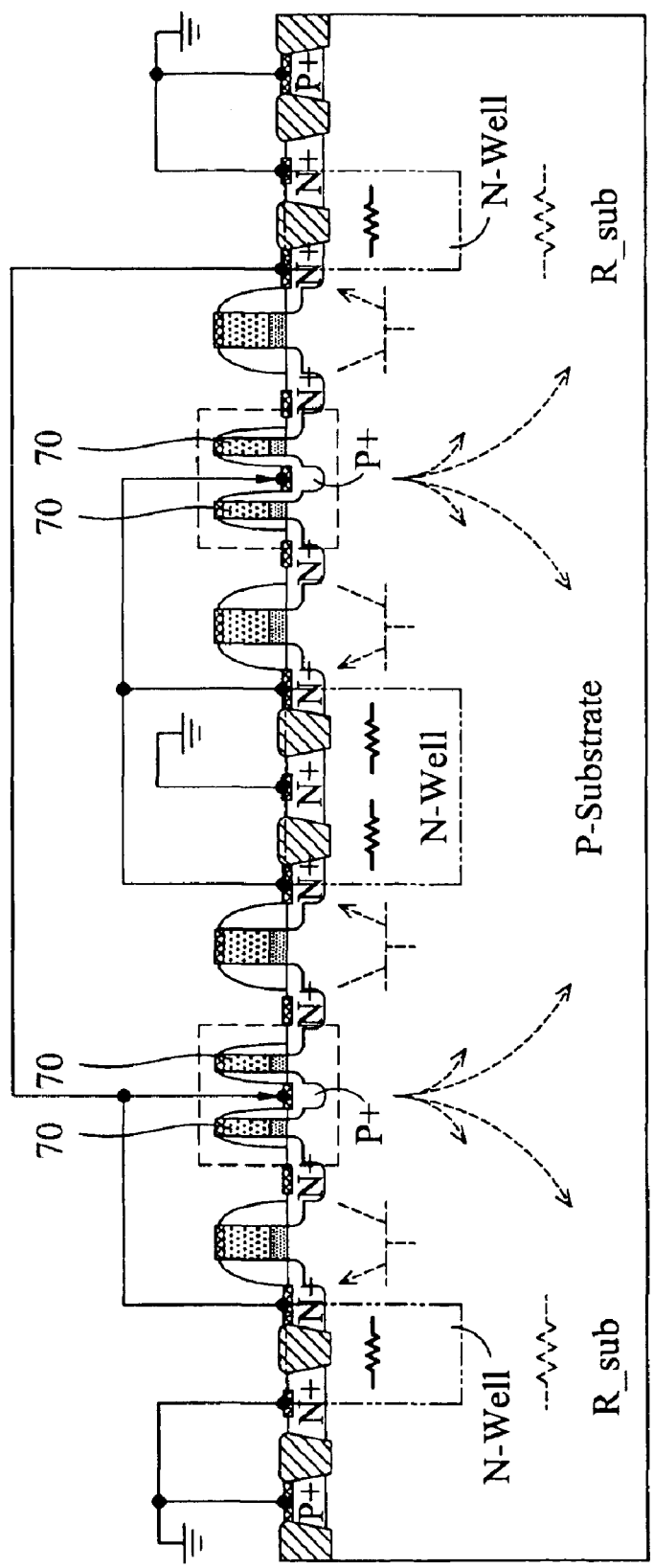
FIG. 18 is a cross section of the layout along the line YY' in FIG. 17, with internal connections resulting in sequential turn-on of the BJTs.
Figure 19:
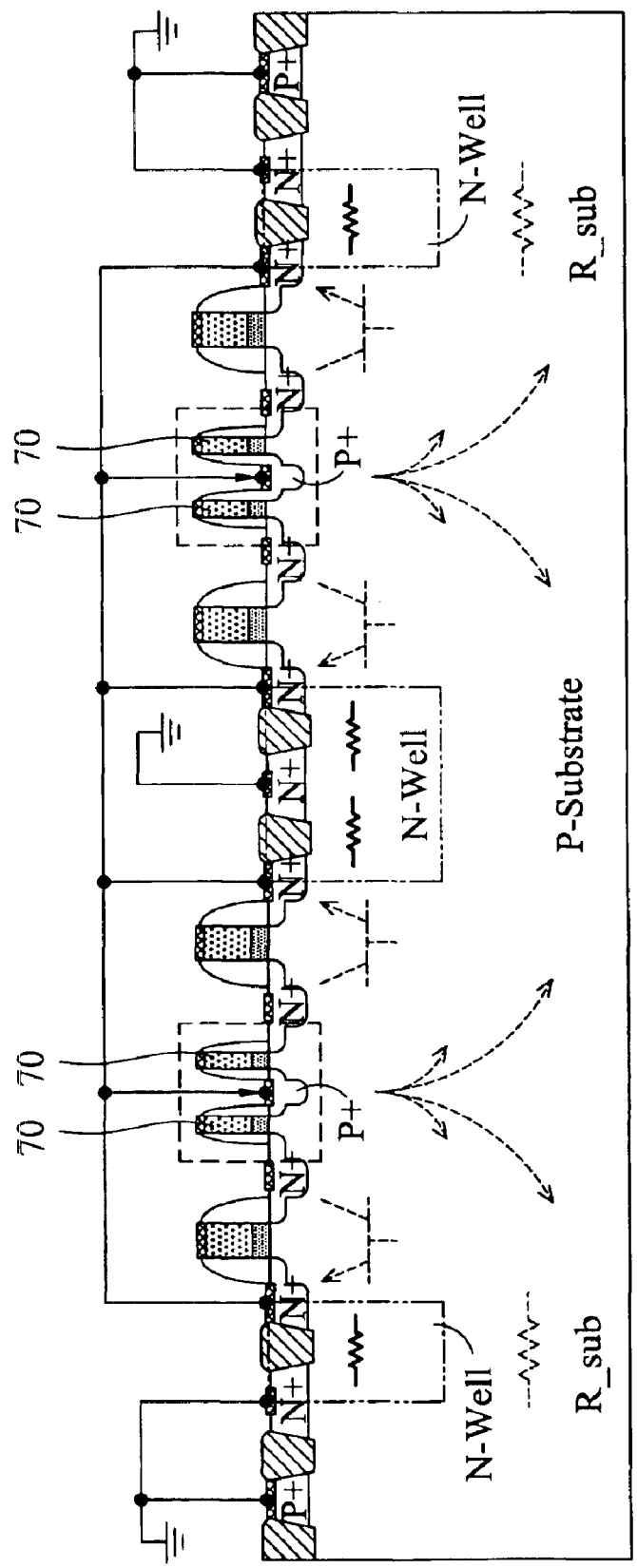
FIG. 19 is a cross section of the layout along the line YY' in FIG. 17, with internal connections resulting in simultaneous turn-on of the BJTs.

The P+ doping regions 50 may be isolated from the N+ doping regions 48 by dummy gates 70, as shown in FIG. 17. FIG. 18 is a cross section of the layout along the line YY' in FIG. 17, with internal connections resulting in sequential activation of the BJTs. FIG. 19 is a cross section of the layout along the line YY' in FIG. 17, with internal connections resulting in simultaneous activation of the BJTs.

Figure 20:
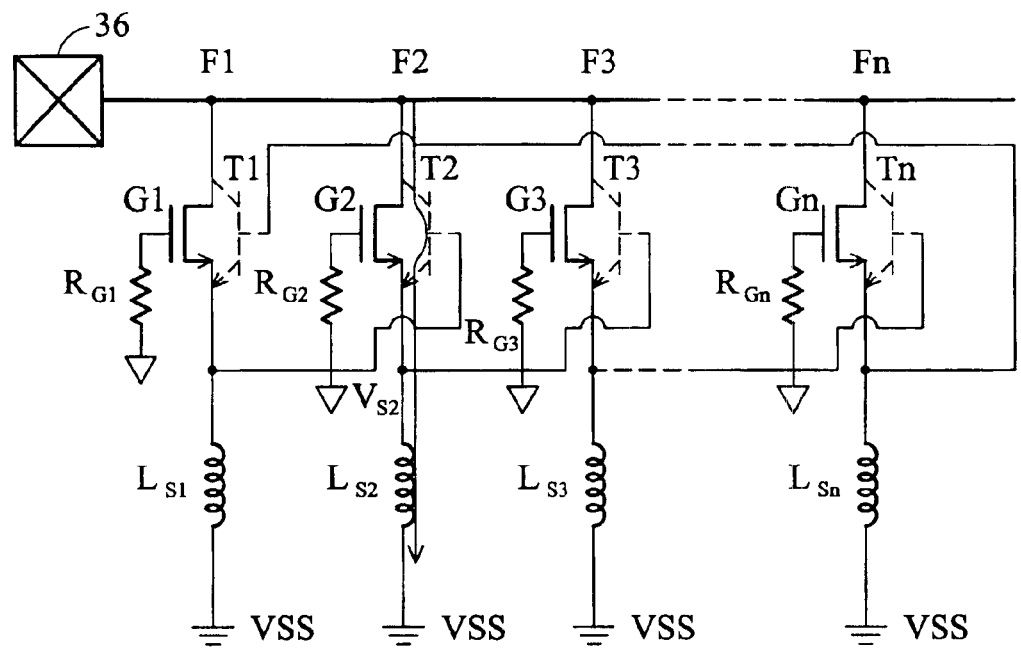
FIGS. 20–22 are schematics of ESD protection circuits with voltage drop elements, each of which is implemented by an inductor, a diode, or a series of diodes.
Figure 21:
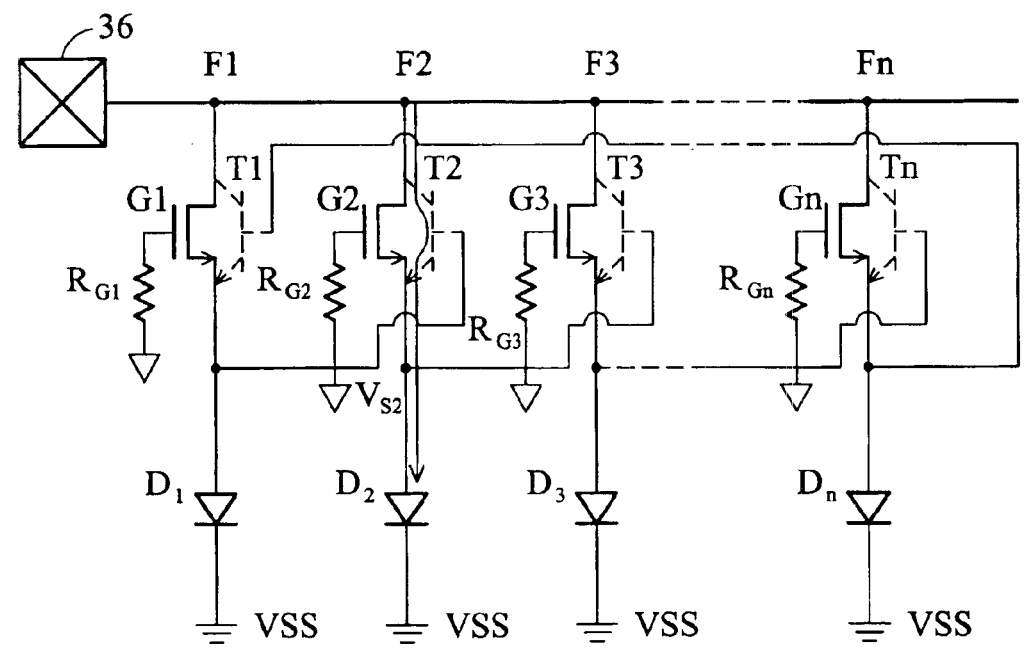
Figure 22:
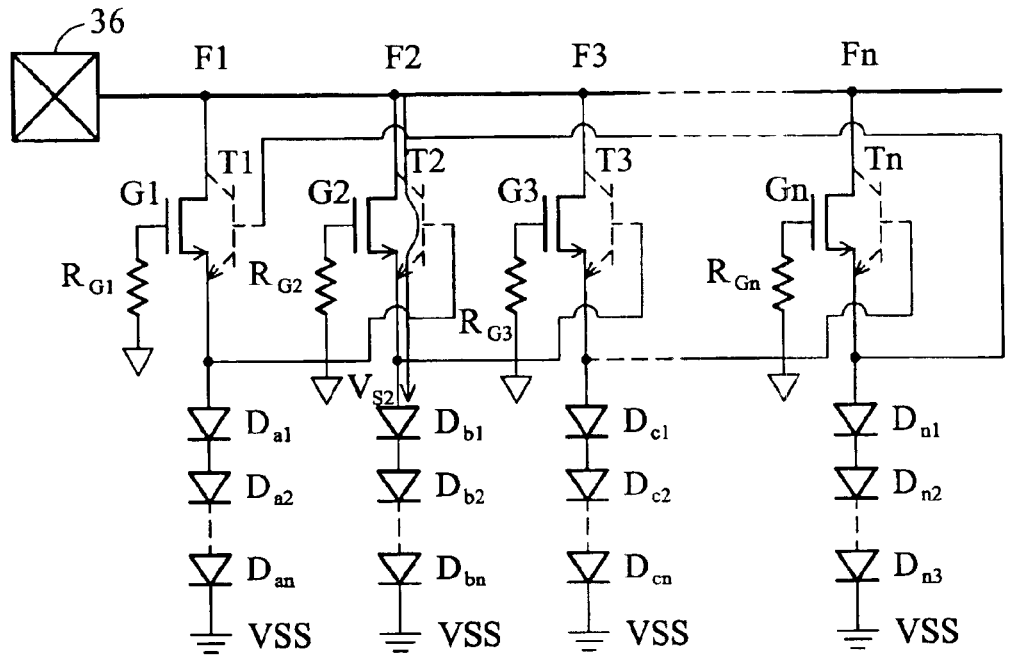

The voltage drop elements 32 raise the voltage level on the finger sources by detecting the large current resulting from an ESD event. In addition to resistors, each of the voltage drop elements may be implemented by an inductor (as shown in FIG. 20), a single diode (as shown in FIG. 21) or a series of diodes (as shown in FIG. 22). It should be noted that if the voltage drop elements 32 are implemented by inductors, the inductance is chosen so that voltage generated by the current variation is not large enough to activate the parasitic BJT during normal operation, but is large enough to activate the parasitic BJT under ESD zapping.

Figure 23:
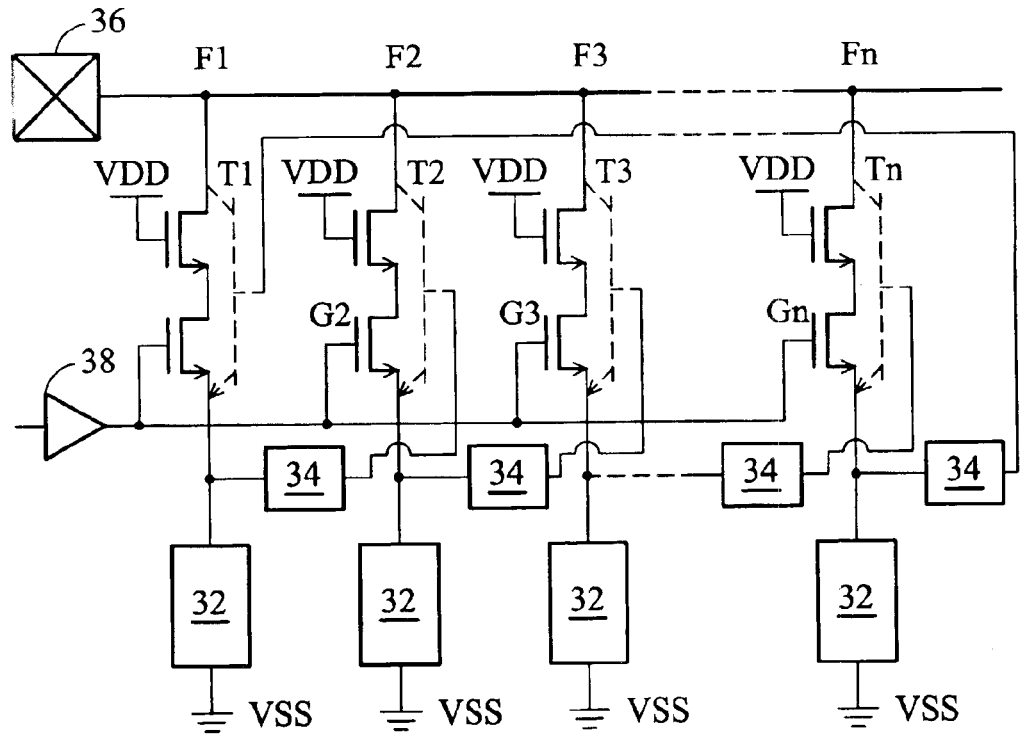
FIG. 23 is a schematic of an ESD protection circuit implemented by stacked NMOS.

Conventional mixed-voltage ICs use stacked NMOS as an ESD protection device or output driver since a stacked NMOS can function with a high-voltage input or output signal. The present invention also applies to a stacked NMOS, wherein the voltage drop elements detect the ESD current flowing through the stacked NMOS and provide feedback to the parasitic BJT below the stacked NMOS, as shown in FIG. 23.

In conclusion, the present invention provides a novel circuit design to improve substrate triggering efficiency for ESD protection devices. The source voltage of ESD protection NMOS is elevated by inserting the voltage drop element between the source and ground; when an ESD pulse is zapped on the drain of the multi-finger NMOS structure. With a voltage-elevated source, a feedback circuit connected from the voltage-elevated source is utilized to bias the base (body) of the parasitic BJT in the multi-finger NMOS. As long as the voltage of the base (body)/emitter (source) junction of lateral NPN BJT is raised over its cut-in voltage (0.7V) due to the voltage drop across the substrate resistor, the parasitic BJT will be activated to discharge ESD current. Thus, the multiple fingers of large-dimension CMOS devices can be uniformly activated to discharge ESD current during ESD events. Moreover, the substrate-triggered technique can further effectively increase ESD robustness in CMOS devices in sub-quarter-micron CMOS technologies.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. An ESD protection circuit with high substrate-triggering efficiency comprising:

a multi-finger-type device having a plurality of finger gates below which parasitic BJTs are formed, a plurality of finger sources, each of which is an emitter of one of the parasitic BJTs, and at least one finger drain coupled to a pad, wherein the finger gates are coupled to a pre-driver;

a plurality of voltage drop elements, each of which is coupled between one of the finger sources and a power line to detect a transient current flowing through one of the finger gates; and a plurality of feedback circuits, each of which is coupled between a base and an emitter respectively of a first and second parasitic BJT, and activates the first BJT to bypass ESD current during an ESD event.

2. The ESD protection circuit as claimed in claim 1, wherein the multi-finger-type device is a multi-finger-type NMOS.

3. The ESD protection circuit as claimed in claim 1, wherein the multi-finger-type device is a multi-finger-type PMOS.

4. The ESD protection circuit as claimed in claim 1, wherein one of the finger gates is coupled to the power line.

5. The ESD protection circuit as claimed in claim 4, wherein one of the finger gates is coupled to the power line through a resistor.

6. The ESD protection circuit as claimed in claim 1, wherein the voltage drop elements are resistors.

7. The ESD protection circuit as claimed in claim 6, wherein the resistors are formed by a well of a first conductivity in a substrate of a second conductivity.

8. An ESD protection circuit with high substrate-triggering efficiency comprising:
- a multi-finger-type device having a plurality of finger gates below which parasitic BJTs are formed, a plurality of finger sources, each of which is an emitter of one of the parasitic BJTs, and at least one finger drain coupled to a pad;
- a plurality of voltage drop elements, each of which is coupled between one of the finger sources and a power line to detect a transient current flowing through one of the finger gates; and
- a plurality of feedback circuits, each of which is coupled between a base and an emitter respectively of a first and second parasitic BJT, and activates the first BJT to bypass ESD current during an ESD event, wherein the voltage drop elements are inductors.

9. An ESD protection circuit with high substrate-triggering efficiency comprising:
- a multi-finger-type device having a plurality of finger gates below which parasitic BJTs are formed, a plurality of finger sources, each of which is an emitter of one of the parasitic BJTs, and at least one finger drain coupled to a pad;
- a plurality of voltage drop elements, each of which is coupled between one of the finger sources and a power line to detect a transient current flowing through one of the finger gates; and
- a plurality of feedback circuits, each of which is coupled between a base and an emitter respectively of a first and second parasitic BJT, and activates the first BJT to bypass ESD current during an ESD event, wherein one of the voltage drop elements is a diode.

10. An ESD protection circuit with high substrate-triggering efficiency comprising:
- a multi-finger-type device having a plurality of finger gates below which parasitic BJTs are formed, a plurality of finger sources, each of which is an emitter of one of the parasitic BJTs, and at least one finger drain coupled to a pad;
- a plurality of voltage drop elements, each of which is coupled between one of the finger sources and a power line to detect a transient current flowing through one of the finger gates; and
- a plurality of feedback circuits, each of which is coupled between a base and an emitter respectively of a first and second parasitic BJT, and activates the first BJT to bypass ESD current during an ESD event, wherein one of the voltage drop elements is a series of diodes.

11. The ESD protection circuit as claimed in claim 1, wherein each of the feedback circuits couples the base of the first parasitic BJT to a collector of the second parasitic BJT.

12. The ESD protection circuit as claimed in claim 1, wherein each of the feedback circuits couples the base and a collector of the first parasitic BJT, and a collector of the second parasitic BJT together.

13. The ESD protection circuit as claimed in claim 1, wherein the multi-finger-type device is a stacked MOS.

14. An ESD protection circuit with high substrate-triggering efficiency formed on a substrate of a second conductivity comprising:
- a guard ring of the second conductivity formed on the substrate as a contact region thereof;
- a plurality of fingers enclosed by the guard ring, each of which has a finger source formed by a first doping region of a first conductivity, a finger drain formed by a second doping region of the first conductivity and coupled to a pad, a finger gate between the first and second doping region, and a substrate current input node formed by a third doping region of the second conductivity enclosed by the second doping region, wherein the first and second doping region, and the proximate substrate form a parasitic BJT;
- a plurality of resistors formed by wells, each of which is coupled between one of the finger sources and a power line; and
- internal connection circuits coupling one of the finger sources to one of the substrate current input nodes to activate a second parasitic BJT by current flowing through a first parasitic BJT and one of the resistors coupled thereto during an ESD event.

15. The ESD protection circuit as claimed in claim 14, wherein each of the resistors is formed by a well of the second conductivity between the first doping region and a fourth doping region coupled to the power line.

16. The ESD protection circuit as claimed in claim 14, wherein a field oxide is disposed between the first and fourth doping region to increase a resistance of the well.

17. The ESD protection circuit as claimed in claim 14, wherein a field oxide is disposed between the second and third doping region isolating one region from the other.

18. The ESD protection circuit as claimed in claim 14, wherein a dummy gate is disposed between the second and third doping region isolating one region from the other.

* * * * *